(12) United States Patent
Lin

(10) Patent No.: US 8,183,901 B2
(45) Date of Patent: May 22, 2012

(54) DELAY LOCKED LOOP CIRCUIT AND METHOD

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/242,539

(22) Filed: Sep. 23, 2011

(65) Prior Publication Data

US 2012/0008439 A1 Jan. 12, 2012

Related U.S. Application Data

(60) Continuation of application No. 12/833,525, filed on Jul. 9, 2010, now Pat. No. 8,026,750, which is a division of application No. 12/026,155, filed on Feb. 5, 2008, now Pat. No. 7,755,404.

(51) Int. Cl.
*H03L 7/06* (2006.01)

(52) U.S. Cl. ......................................... 327/158; 327/149

(58) Field of Classification Search .................. 327/149, 327/158
See application file for complete search history.

(56) References Cited

U.S. PATENT DOCUMENTS

| | | | | |
|---|---|---|---|---|
| 5,463,337 A * | 10/1995 | Leonowich | ................... | 327/158 |
| 5,663,665 A | 9/1997 | Wang et al. | | |
| 6,304,116 B1 * | 10/2001 | Yoon et al. | ..................... | 327/158 |
| 6,424,192 B1 * | 7/2002 | Lee et al. | ....................... | 327/156 |
| 6,667,641 B1 * | 12/2003 | Wang et al. | ................... | 327/156 |
| 7,190,201 B2 * | 3/2007 | Haerle et al. | ................... | 327/158 |
| 7,236,028 B1 * | 6/2007 | Choi | .............................. | 327/158 |
| 7,282,972 B2 * | 10/2007 | Lin | ................................ | 327/158 |
| 7,327,176 B2 * | 2/2008 | Takai et al. | .................... | 327/158 |
| 7,346,139 B2 * | 3/2008 | Henrickson | ................... | 375/355 |
| 7,348,823 B2 * | 3/2008 | Takai et al. | .................... | 327/291 |
| 7,471,131 B2 * | 12/2008 | Liu et al. | ....................... | 327/158 |
| 7,496,168 B2 * | 2/2009 | Leonowich et al. | .......... | 375/376 |
| 7,755,404 B2 | 7/2010 | Lin | | |
| 8,026,750 B2 | 9/2011 | Lin | | |
| 2005/0068076 A1 * | 3/2005 | Iroaga | .......................... | 327/158 |
| 2006/0085662 A1 * | 4/2006 | Chua-Eoan et al. | .......... | 713/600 |

(Continued)

OTHER PUBLICATIONS

Lee, Ki-Won, et al., "A 1.5-V 3.2 Gb/s/pin Graphic DDR4 SDRAM with Dual-Clock System, Four-Phase Input Strobing, and Low-Jitter Fully Analog DLL", IEEE Journal of Solid-State Circuits, vol. 42, No. 11, (Nov. 2007), 2369-2377.

*Primary Examiner* — Lincoln Donovan
*Assistant Examiner* — Adam Houston
(74) *Attorney, Agent, or Firm* — Schwegman, Lundberg & Woessner, P.A.

(57) ABSTRACT

Delay locked loop circuits and methods are disclosed. In the embodiments, a delay locked loop may include a phase detector to detect a phase difference between a clock signal and a reference clock signal, and a charge pump that receives the detected phase difference. A low pass filter may filter an output from the charge pump. The delay locked loop may further include a delay line having a plurality of delay elements, the plurality of delay elements including a first selectable group and a second selectable group that is larger than the first selectable group. A first clock signal from the first group of delay elements may be provided to the phase detector to first synchronize the delay locked loop, and following the synchronization, a second clock signal from the second group may be employed to synchronize the delay locked loop.

20 Claims, 6 Drawing Sheets

U.S. PATENT DOCUMENTS

| | | | |
|---|---|---|---|
| 2006/0087435 A1* | 4/2006 | Kim et al. | 340/572.1 |
| 2007/0069825 A1* | 3/2007 | Wong et al. | 331/46 |
| 2007/0120587 A1* | 5/2007 | Haerle et al. | 327/158 |
| 2007/0195637 A1* | 8/2007 | Lin | 365/233 |
| 2008/0030248 A1* | 2/2008 | Song | 327/158 |
| 2008/0231333 A1* | 9/2008 | Huang | 327/157 |
| 2009/0066379 A1* | 3/2009 | Kim et al. | 327/149 |
| 2009/0091362 A1* | 4/2009 | Pellerano et al. | 327/158 |
| 2009/0195279 A1 | 8/2009 | Lin | |
| 2010/0271889 A1 | 10/2010 | Lin | |

* cited by examiner

DELAY LOCKED LOOP CIRCUIT AND METHOD

RELATED APPLICATION

This application is a continuation of U.S. application Ser. No. 12/833,525, filed Jul. 9, 2010 now U.S. Pat. No. 8,026,750, which is a divisional of U.S. application Ser. No. 12/026,155, filed Feb. 5, 2008, now issued as U.S. Pat. No. 7,755,404, both of which are incorporated herein by reference in their entirety.

BACKGROUND

A semiconductor memory device may employ internal clock signals to control various operations of the memory device. For example, it is desirable to properly synchronize input and output operations of the memory device with other external circuits in an interconnected system in order to minimize idle time on a communications bus, and to avoid undesirable data collisions while data is communicated to and from the memory device.

The internal clock signals may be generated from externally-generated clock signals that may be applied to the memory device. Due to the interaction of the externally-generated clock signals with various circuits within the memory device, the internal clock signals may be adversely affected, so that the internal clock signals are time-delayed relative to the externally-generated clock signals. Accordingly, delay locked loop (DLL) circuits may be used to provide properly synchronized internal clock signals. Typically, the DLL circuit detects a difference between the internal clock signals and externally-generated clock signals, and incrementally applies a delay to the externally-applied clock signals so that the externally-generated clock signals and the internal clock signals remain properly synchronized.

BRIEF DESCRIPTION OF THE DRAWINGS

Various embodiments are described in detail in the discussion below and with reference to the following drawings.

DETAILED DESCRIPTION

The various embodiments include synchronization circuits and methods, and analog delay line circuits for clock synchronization. Specific details of several embodiments are set forth in the following description and in FIGS. 1 through 6 to provide a thorough understanding of such embodiments. One of ordinary skill in the art, however, will understand that additional embodiments are possible, and that many embodiments may be practiced without several of the details disclosed in the following description. The various embodiments may be implemented within a physical circuit, or they may be implemented within machine-readable media. For example, the various embodiments, as herein discussed, may be stored upon and/or embedded within machine-readable media associated with design tools used for designing semiconductor devices. For example, net list files, or other machine-readable media for semiconductor design in a simulation environment may be used to implement the various embodiments.

Figure 1:
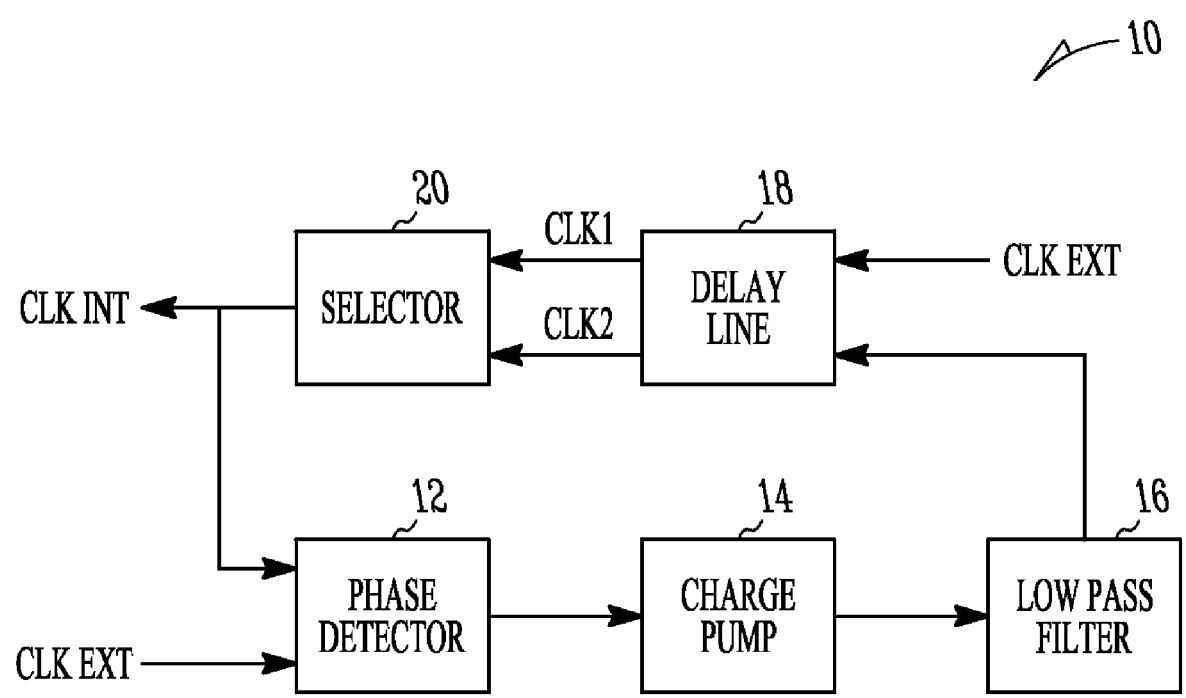
FIG. 1 is a diagrammatic block view of a delay locked loop, according to various embodiments.

FIG. 1 is a diagrammatic block view of a delay locked loop (DLL) 10, according to one or more embodiments. The DLL 10 includes a phase detector 12 that is configured to receive an internal clock signal CLK INT and an external clock signal CLK EXT, and also to detect a phase difference between the external clock signal CLK EXT and the internal clock signal CLK INT. Accordingly, the phase detector 12 is operable to compare phases of the CLK EXT signal and the CLK INT signal, and also to generate an error signal that is proportional to a difference between the phases. The phase detector 12, in one implementation, may include an exclusive OR (XOR) gate that receives input signals, and provides a direct current (DC) output that is proportional to phase difference between the signals, so that if the input signals are exactly in phase, the DC output is zero volts. Alternatively, other circuits are available that may be used for the phase detector 12. For example, the phase detector 12 may include other arrangements and combinations of logical devices that are configured to detect a phase difference between input signals, such as a JK flip-flop, or other similar logical circuits that provide an output signal that corresponds to a phase difference between the input signals. A charge pump 14 is configured to perform a charge pumping function on an output signal received from the phase detector 12. Accordingly, the charge pump 14 may include various arrangements of charge-storage devices, such as capacitors, which are coupled to suitable switching devices that are configured to release a stored charge from the charge-storage devices to an output of the charge pump 14. A low pass filter 16 is coupled to the charge pump 14 configured to receive the output from the charge pump and to perform a low pass filtering operation on the received output. Accordingly, the low pass filter 16 may include any combination of active and/or passive elements that are suitably configured to generate a predetermined cut-off frequency.

The DLL 10 also includes a delay line 18 that receives an output from the low pass filter 16, and also receives the external clock signal CLK EXT. In general terms, the delay line 18 includes a plurality of serially-coupled delay elements that delay the external clock signal CLK EXT in response to an output voltage received from the low pass filter 16. The delay elements are each operable to delay an output signal relative to an input signal so that signals communicated along the delay line 18 are successively delayed. The delay elements may provide a variable gain at each stage, or they may be configured to provide a fixed gain at each stage. The delay line 18 is also configured to provide outputs at selected intermediate positions along the delay line 18. Accordingly, the delay line 18 may generate a first clock signal CLK 1 and a second clock signal CLK2, which may be communicated to other portions of the DLL 10, as will be discussed in detail below. The delay line 18 may be comprised of a plurality of serially-coupled differential amplifiers that are configured to provide a differential output to subsequent stages, and may also optionally include still other stages for buffering, or to adjust loading on the delay line 18.

The delay line 18 may be coupled to a selector 20 that receives the first clock signal CLK 1 from a first location on the delay line 18 and the second clock signal CLK 2 from a second and subsequent intermediate position, on the delay line 18. The selector 20 may also receive the phase difference information from the phase detector 12. The selector 20 is operable to select the first clock signal CLK 1 so that the CLK 1 signal is employed as a first feedback quantity in the DLL 10. When the phase detector 12 indicates that the detected phase difference is minimized, the selector 20 is further operable to select the second clock signal CLK 2 as a second feedback quantity, which may then be continuously used as the selected feedback quantity, provided that the DLL 10 remains suitably locked (e.g., the phase difference detected by the phase detector 12 remains at or near zero).

The inventor has made the discovery that selecting a feedback quantity from a first intermediate location in a delay line, and, upon achieving an acceptable frequency lock based upon a detected phase difference, selecting a feedback quantity from a second location in the delay line, generally achieves synchronization between an internal clock signal (e.g., CLK INT) and an external clock signal (e.g., CLK EXT) faster than other comparable methods. For example, it is anticipated that if only a feedback quantity from the first intermediate location is used for synchronization, additional circuits, such as duty cycle correction (DCC) circuits, or other similar circuits, will be required for successful operation. Alternatively, if only a feedback quantity from the second location is used, additional logic circuits will be required to successfully achieve locking. In either case, additional circuits are implicated, which may undesirably increase the size of an integrated circuit chip by occupying additional chip "real estate". The additional circuits may also undesirably increase thermal dissipation requirements for the chip, since the operation of additional circuits will contribute still additional heat to the chip. Various operating details will be discussed in greater detail below.

Figure 2:
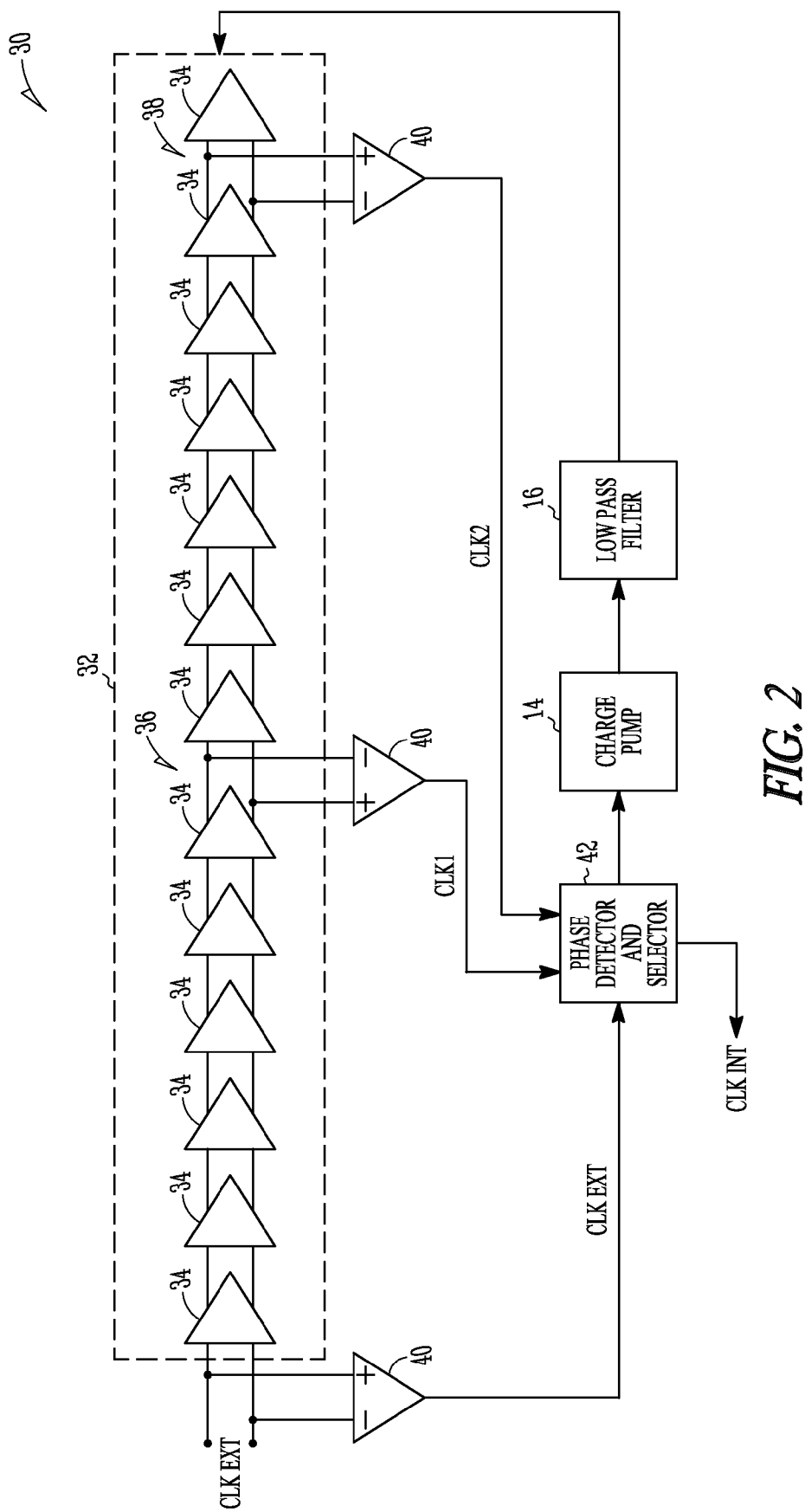
FIG. 2 is a partial schematic view of a delay locked loop, according to various embodiments.

FIG. 2 is a partial schematic view of a DLL 30, according to various embodiments. In the examples that follow, it is understood that several of the details have been discussed previously. Therefore, in the interest of brevity, and for clarity of description, these details may not be discussed further. The DLL 30 includes a delay line 32 that includes a plurality of differentially-coupled delay stages 34. In the various embodiments, the number of delay stages 34 may be approximately twelve, although a larger or smaller number of delay stages 34 may be used in the various embodiments. The delay line 32 is configured to receive the external clock signal CLK EXT at one end. The delay line 32 may be selectively accessed at a first location 36 on the delay line 32, and at a second location 38. Accordingly, a signal accessed at the first location 36 provides the CLK EXT signal that is phase-shifted by a first phase shift amount, while a signal accessed at the second location provides the CLK EXT signal that is phase-shifted by a second phase shift amount that greater than the first phase shift amount. In the various embodiments, the first phase shift amount may be approximately π radians (180 degrees), and the second phase shift amount may be approximately 2π radians (360 degrees), although other locations along the delay line may be selected A buffer stage 40 may be coupled to the first location 36 and the second location 38. A buffer stage 40 may also be coupled to an input to the delay line 32 to provide the CLK EXT signal to other portions of the DLL 30. An additional buffer stage 40 may be optionally coupled to the input to the delay line 32.

With reference still to FIG. 2, the operation of the DLL 30 will now be described in detail. Synchronization of the internal clock signal CLK INT with the external clock signal CLK EXT may be approximated first using the CLK 1 signal obtained at the first location 36. Accordingly, the CLK 1 signal is used as the first feedback quantity, which is selectively applied to a phase detector and selector unit 42. A phase difference between the first feedback quantity (e.g., the CLK 1 signal) and the CLK EXT signal may then be determined. The phase difference may then be output to the charge pump 14 (as previously described in connection with FIG. 1) that generates a control voltage by increasing a voltage level of an output from the phase detector and selector unit 42. The output from the charge pump 14 may then be output to the low pass filter 16 that attenuates selected higher frequency components in the control voltage, which may thereupon be applied to the delay line 32. When a detected phase difference using the CLK 1 signal is minimized so that the DLL 30 has at least approximately synchronized the CLK INT signal and the CLK EXT signal, the phase detector and selector unit 42 selects the CLK 2 signal as a second feedback quantity. The synchronization of the CLK INT signal and the CLK EXT then continues within the DLL 30 using the second feedback quantity. Although FIG. 2 depicts discrete functional elements, it is understood that the elements shown therein may be combined into fewer elements having the same functionality, if desired. Moreover, the discrete functional elements shown therein may be further subdivided into a larger number of discrete elements, if desired.

Figure 3:
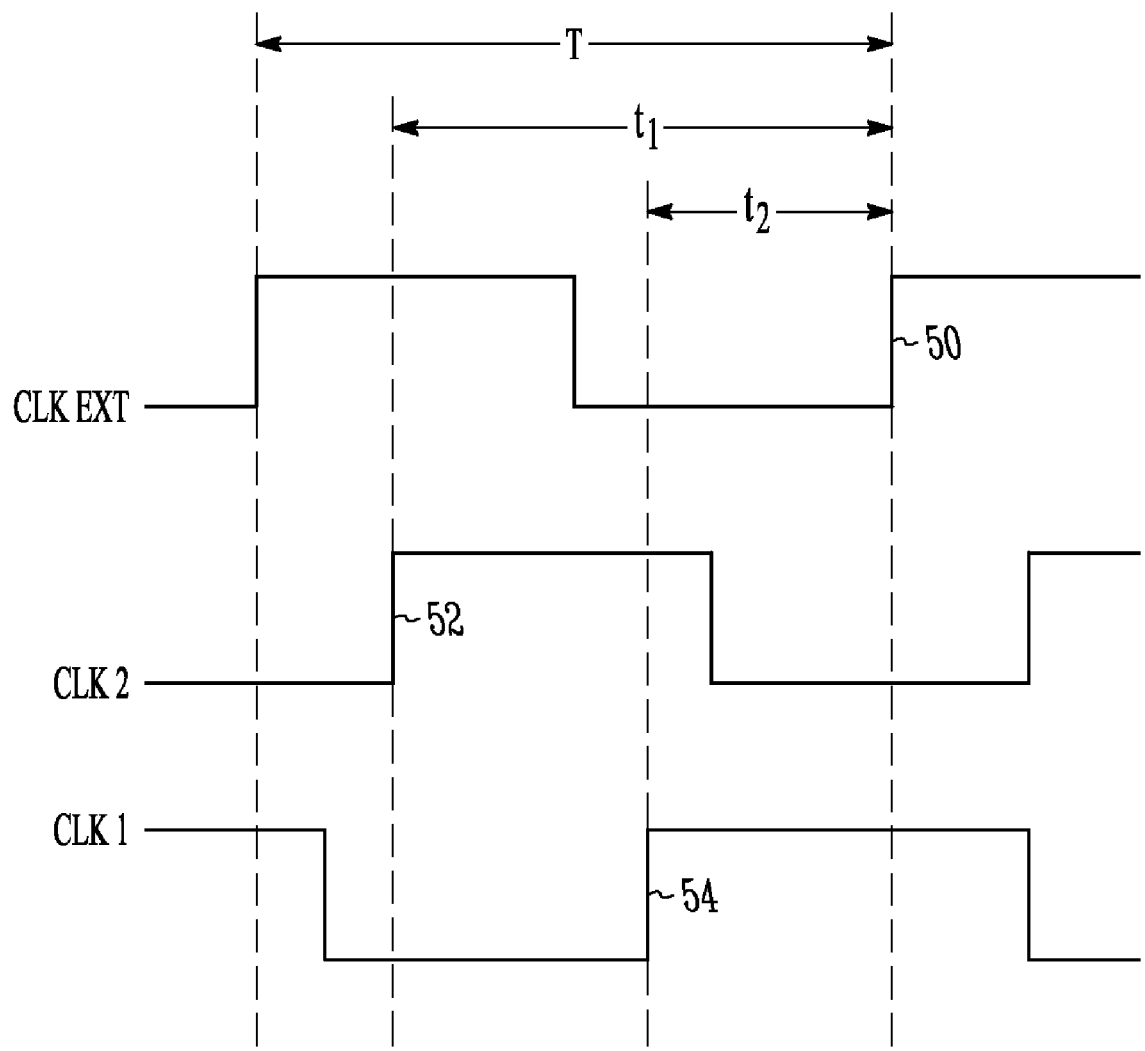
FIG. 3 is a timing diagram comparing delay variations obtainable from the delay locked loop, according to various embodiments.

FIG. 3 is a timing diagram that compares delay variations obtainable from a DLL, according to various embodiments. It is understood that in the discussion that follows, the delay variations illustrated herein may be representative approximations of delay variations present in the DLL 10 of FIG. 1 and the DLL 30 of FIG. 2. In general, the CLK EXT signal has a period T, and a rising edge 50. The CLK 2 signal, which is obtained from the second location on the delay line (of FIG. 1 and FIG. 2) also includes a rising edge 52 that is spaced apart (due to a corresponding phase difference between CLK EXT signal and the CLK 2 signal) by a time $t_1$. Similarly, the CLK 1 signal has a rising edge 54 that is spaced apart from the rising edge 50 of the CLK EXT signal by a time $t_2$. In general terms, the DLL of FIG. 1 and FIG. 2 may provide synchronization between the CLK EXT signal and either of the CLK 1 signal and the CLK 2 signal by phase-shifting either the CLK 1 signal and the CLK 2 signal to bring the respective rising edge 54 and the rising edge 52 in coincidence with the rising edge 50 of the CLK EXT signal. The inventor has discovered, however, that the DLL may synchronize the CLK EXT signal and the CLK 1 signal faster (e.g., in fewer cycles) than the DLL synchronizes the CLK EXT signal and the CLK 2 signal, since it has been observed that the time $t_2$ is less than the time $t_1$. Accordingly, the DLL first synchronizes the CLK EXT signal using the CLK 1 signal as a first feedback quantity until an acceptably small phase difference between the CLK EXT and the first feedback quantity is obtained. The DLL then employs the CLK 2 signal as a second feedback quantity to maintain synchronization. The inventor has further made the discovery that using the CLK 2 signal for synchronization following a first, faster synchronization using the CLK 1 signal provides improved phase alignment without the use of additional logic, which would be required if only the CLK 2 signal was employed for synchronization, and without the use of additional circuits for duty cycle correction (DCC), which would be required if only the CLK 1 signal was employed for synchronization.

Figure 4:
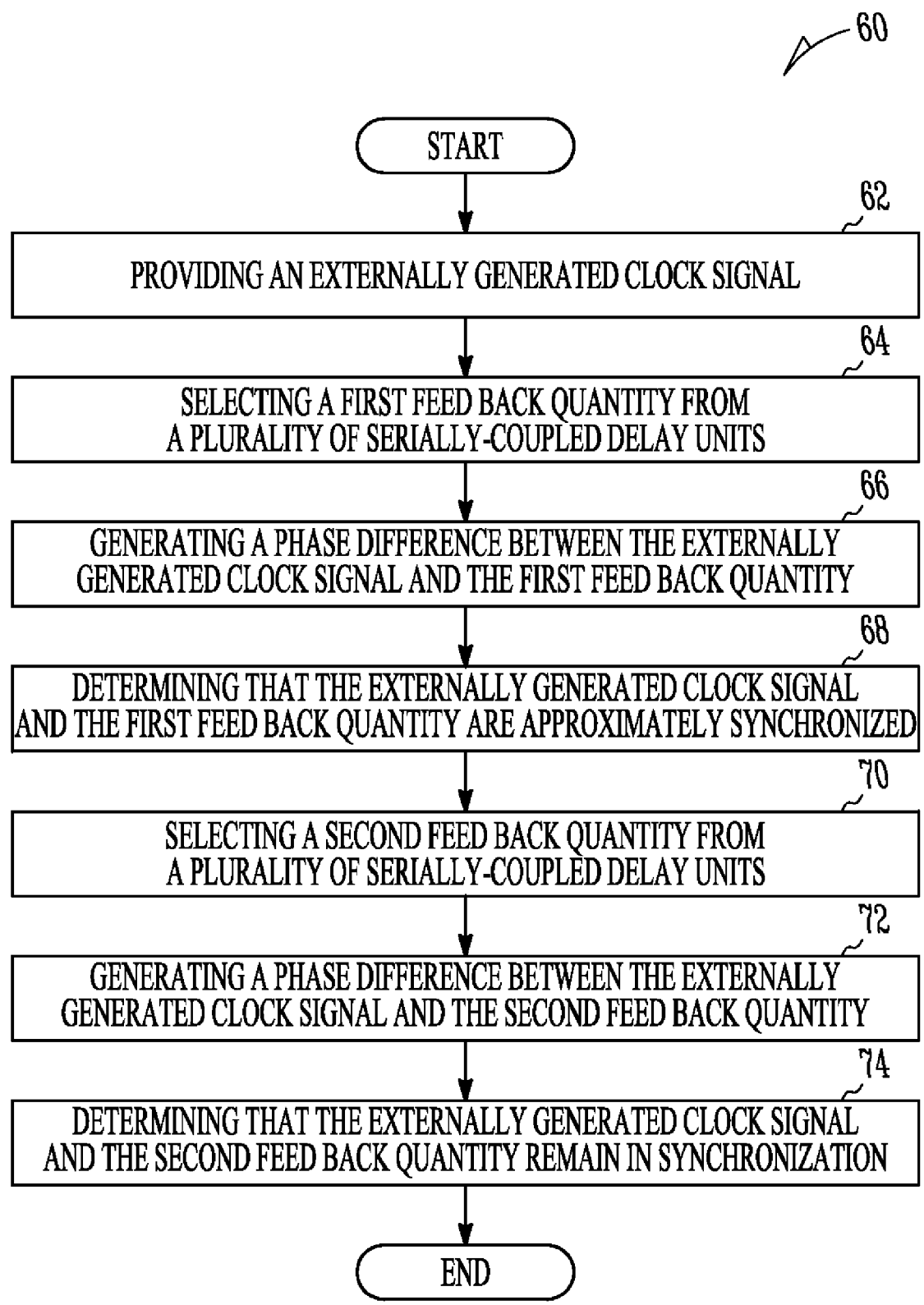
FIG. 4 is a flowchart that describes a method of operating a clock synchronization circuit, according to the various embodiments.

FIG. 4 is a flowchart that will be used to describe a method 60 of operating a clock synchronization circuit, according to the various embodiments. At block 62, an external clock signal (e.g., the CLK EXT signal) is provided. The external clock signal may be obtained from an external device, such as a processing unit, or it may be obtained from another synchronous device. At block 64, a first feedback quantity is selected from a plurality of serially-coupled delay units. At block 66, a phase difference between the external clock signal and the first feedback quantity is determined. The phase difference may be determined, for example, in a phase comparator, as described in detail above. At block 68, it is determined if the external clock signal and the first feedback quantity are synchronized. Synchronization is achieved when the generated phase difference is sufficiently small (e.g., the phase difference is sufficiently close to zero using a convergence criterion that is selectable). At block 70, a second feedback quantity that is different from the first feedback quantity is selected from the plurality of serially-coupled delay units. At block 72, a phase difference between the external clock signal and the second feedback quantity is determined. At block 74, the synchronization continues by determining that the external clock signal and the second feedback quantity remain in synchronization by minimizing a phase difference between the external signal and the second feedback quantity.

Figure 5:
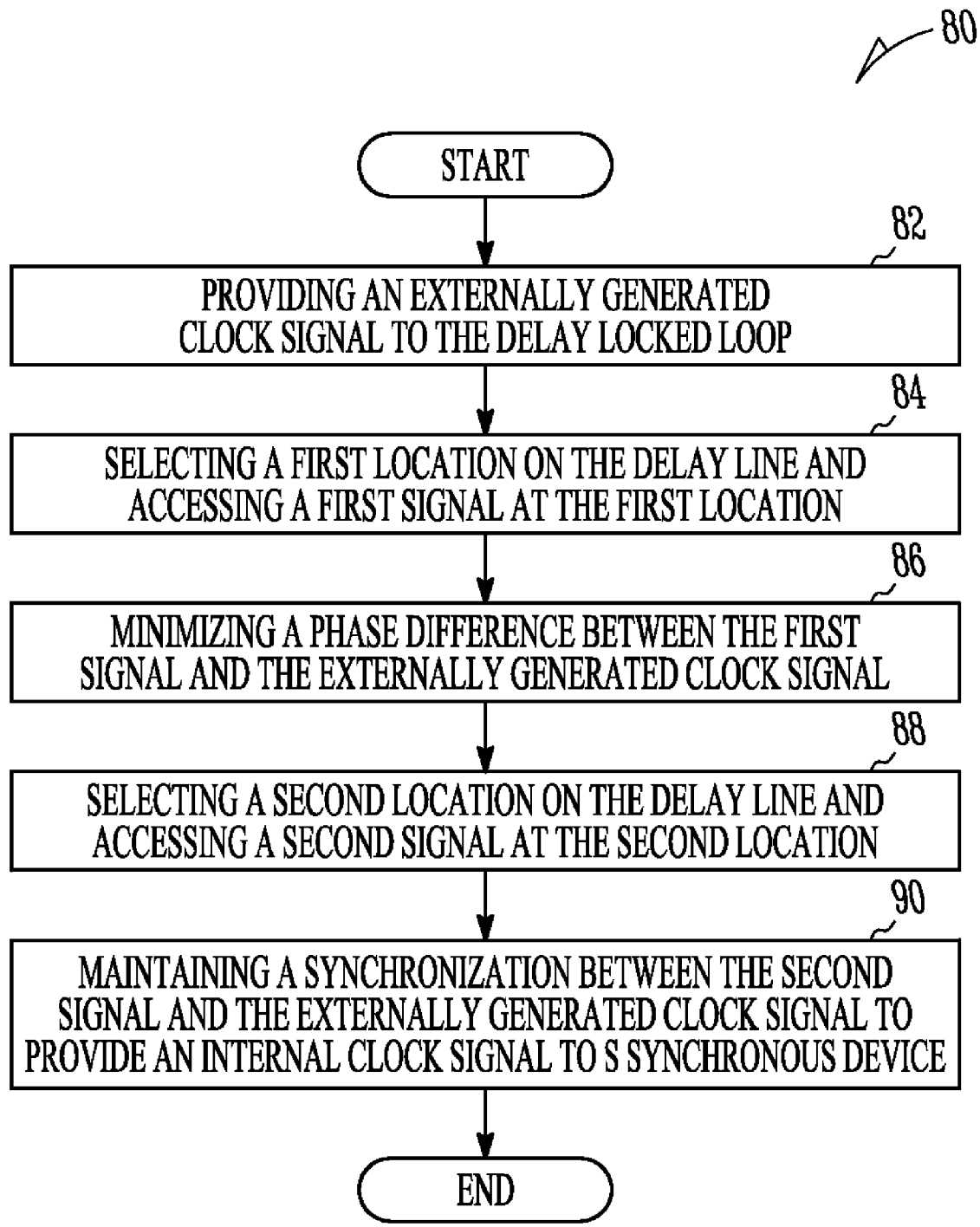
FIG. 5 is a flowchart that describes a method of operating a delay locked loop, according to the various embodiments.

FIG. 5 is a flowchart that will be used to describe a method 80 of operating a DLL, according to the various embodiments. As a preliminary matter, an initial bias voltage provided to the delay elements in the DLL may be controlled in order to prevent a "false-locking" condition when energy is applied to the DLL (e.g., at the first application of power to the circuit, or during a reset condition). At block 82, an external clock signal is provided to a DLL. At block 84, a first location on a delay line is selected, and a first signal is accessed at the first location. At block 86, a phase difference between the first signal and the external clock signal is minimized. For example, a phase detection circuit, as previously described, may be used to determine the phase difference. At block 88, a second location on a delay line is selected, and a second signal is accessed at the second location, where the second location is different from the first location. At block 90, synchronization between the second signal and the external clock signal is maintained. Accordingly, an internal clock signal may be provided to a synchronous device based upon the synchronization.

Figure 6:
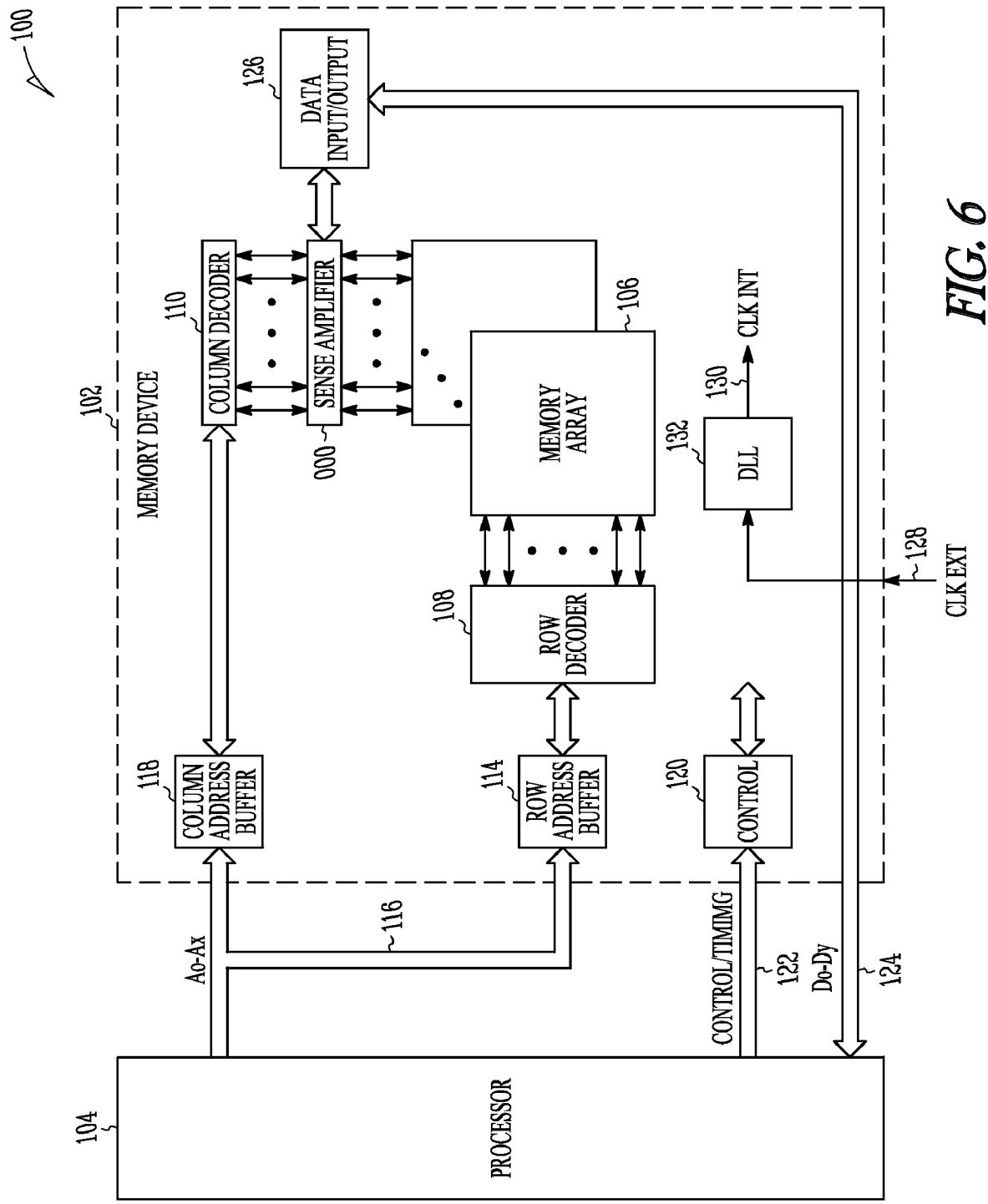
FIG. 6 is a diagrammatic block view of an electronic system according to the various embodiments.

FIG. 6 is a diagrammatic block view of an electronic system 100 according to various embodiments. The electronic system 100 may include one or more integrated circuit dynamic memory devices 102, coupled to a processor 104. The integrated circuit dynamic memory device 102 typically includes a plurality of dynamic memory cells that are generally arranged in rows and columns in one or more memory arrays 106. The integrated circuit dynamic memory device 102 may also include a row decoder 108 and a column decoder 110. The row decoder 108 operates in combination with a row address buffer 114 to receive address signals on an address bus 116 coupled to the processor 104. Accordingly, the address signals received by the row decoder 108 and the row address buffer 114 are operable to direct the integrated circuit dynamic memory device 102 to one or more rows in the array 106. Similarly, a column address buffer 118 may be provided that operates in combination with the column decoder 110 to receive the address signals on the address bus 116, so that the integrated circuit dynamic memory device 102 may be directed to one or more columns in the array 106.

The electronic system 100 may also include a control unit 120, which is operable to receive control signals on a control/timing bus 122, and to interpret various memory access requests. Once the integrated circuit dynamic memory device 102 is properly accessed by receiving suitable control and address signals from the processor 104, data may be communicated to or from the integrated circuit dynamic memory device 102 on a data bus 124, which is coupled to a data input/output unit 126. The data input/output unit 126 is operable to read or write the data to the array 106 in combination with a sense amplifier 112.

The integrated circuit dynamic memory device 102 may comprise a synchronous memory device, which is synchronized by an external clock signal 128, such as the previously-described CLK EXT signal, so that the various memory operations may be synchronously performed at selected times. Examples of such synchronous integrated memory devices may include synchronous dynamic random access memory (SDRAM) devices, synchronous static random access memory (SSRAM) devices, and may further include memory devices such as a synchronous link dynamic access memory (SLDRAM) devices, a RAMBUS dynamic random access memory (RDRAM), as well as other memory devices. Accordingly, an internal clock signal 130, such as the previously-described CLK INT signal, may be generated from the external clock signal 128. The internal clock signal 130 may be generated using the DLL 132, according to the various embodiments discussed in detail above. Accordingly, the internal clock signal may be operable to control various timing-related operations in the synchronous memory device, such as, for example, read/write operations, bus synchronization, memory refresh timing, as well as other operations. Although not shown in FIG. 6, it is nevertheless understood that additional circuitry may be present in FIG. 6, which may be omitted in the interests of brevity of description, and in order to focus on the various embodiments. It is further understood that the DLL 132 may be formed as an integral portion of the integrated circuit dynamic memory device 102, or it may be formed separately from the integrated circuit dynamic memory device 102.

While the various embodiments of the invention have been illustrated and described, as noted above, many changes can be made without departing from this disclosure. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the various embodiments are defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. Furthermore, although the various embodiments been described with reference to memory systems and devices, it is understood that the various embodiments may be employed in a variety of known electronic systems and devices without modification of any kind. This disclosure is intended to cover any and all adaptations or variations of various embodiments. Combinations of the above embodiments, and other embodiments not specifically described herein, will be apparent to those of ordinary skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features may be grouped together in a single embodiment for the purpose of streamlining the disclosure. This method of disclosure is not to be interpreted as reflecting an intention that the claimed embodiments require more features than are expressly recited in each claim. Thus the following claims are hereby incorporated into the Detailed Description, with each claim standing on its own as a separate embodiment.

What is claimed is:

1. A delay locked loop, comprising:
   a phase detector to detect a phase difference relative to an external clock signal;
   a delay line having a plurality of serially-coupled delay elements including a first selectable group having a first location and a second selectable group having a second location, wherein a first clock signal from the first selectable group is first accessed at the first location and provided to the phase detector to first synchronize the delay locked loop, and following the first synchronization, a second clock signal from the second selectable group is accessed at the second location to second synchronize the delay locked loop; and
   a selector to receive the first clock signal and the second clock signal, and to provide the second clock signal to the phase detector following the first synchronization.

2. The delay locked loop of claim 1, further comprising:
   a charge pump configured to perform a charge pumping operation based upon the phase difference.

3. The delay locked loop of claim 1, wherein the first location and the second location are the only clock access locations in the delay line.

4. The delay locked loop of claim 1, wherein the plurality of serially-coupled delay elements in the first selectable group are configured to phase-shift the external clock signal by approximately π radians.

5. The delay locked loop of claim 1, wherein the plurality of serially-coupled delay elements in the second selectable group are configured to phase-shift the external clock signal by approximately 2π radians.

6. The delay locked loop of claim 1, wherein the second selectable group has more delay stages than the first selectable group.

7. The delay locked loop of claim 6, wherein the second selectable group includes approximately twice as many delay stages as the first selectable group.

8. The delay locked loop of claim 1, wherein the delay line includes at least one buffer stage.

9. The delay locked loop of claim 1, wherein the first location is positioned at an end of the first selectable group of delay elements, and the second location is positioned at an end of the second selectable group of delay elements.

10. The delay locked loop of claim 1, wherein the serially-coupled delay elements in the first selectable group are configured to phase-shift the external clock signal by a first phase shift amount, and wherein the serially-coupled delay elements in the second selectable group are configured to phase-shift the external clock signal by a second phase shift amount greater that the first phase shift amount.

11. An electronic system, comprising:
    a memory device including an array of memory cells operatively coupled to a processor;
    a control circuit controlled by the processor to perform operations on the array of memory cells in synchronization with transitions of an external clock signal; and
    a delay locked loop comprising:
       a phase detector configured to detect a phase difference between an internal clock signal and the external clock signal;
       a delay line having a plurality of serially-coupled delay elements including a first selectable group having a first access location and a second selectable group having a second access location, wherein a first clock signal from the first selectable group of serially-coupled delay elements is first provided to the phase detector from the first access location to first synchronize the delay locked loop, and following the first synchronization, a second clock signal is provided by the second selectable group to the phase detector from the second access location to second synchronize the delay locked loop; and
       a selector configured to receive the first clock signal and the second clock signal, and to provide the second clock signal to the phase detector following the first synchronization.

12. The electronic system of claim 11, wherein the delay locked loop further comprising:
    a low pass filter configured to filter an output from a charge pump configured to operate according to the phase difference.

13. The electronic system of claim 11, wherein the second selectable group is larger than the first selectable group.

14. The electronic system of claim 11, wherein the first access location and the second access location are the only clock access locations in the delay line, and wherein the first access location provides a smaller delay amount than the second access location.

15. The electronic system of claim 11, wherein the plurality of serially-coupled delay elements in the first selectable group are configured to phase-shift the external clock signal by approximately a multiple of π radians.

16. The electronic system of claim 11, wherein the plurality of serially-coupled delay elements in the second selectable group are configured to phase-shift the external clock signal by approximately a multiple of 2π radians.

17. The electronic system of claim 11, wherein the first access location is positioned at an end of the first selectable group of delay elements, and the second access location is positioned at an end of the second selectable group of delay elements.

18. The electronic system of claim 11, wherein the plurality of serially-coupled delay elements in the first selectable group are configured to phase-shift the external clock signal by a first phase shift amount, and wherein the serially-coupled delay elements in the second selectable group are configured to phase-shift the external clock signal by a second phase shift amount, the first phase shift amount being greater that the second phase shift amount.

19. An apparatus, comprising:
    a selector to select a first clock signal from a first portion of a signal delay line and a second clock signal from a second portion of the signal delay line; and
    circuitry, including a phase detector, to synchronize the first clock signal and the second clock signal with a reference clock signal, wherein the selector is configured to receive the first clock signal and the second clock signal, and to provide the second clock signal to the phase detector following synchronization based upon the first clock signal.

20. The apparatus of claim 19, wherein the first clock signal is selected from the first portion of the signal delay line by phase-shifting the first clock signal relative to the reference clock signal by approximately π radians, and wherein the second clock signal is selected from the second portion of the signal delay line by phase-shifting the second clock signal relative to the reference clock signal by approximately 2π radians.

* * * * *